United States Patent [19]
Tokumasu et al.

[11] Patent Number: 5,915,200
[45] Date of Patent: Jun. 22, 1999

[54] FILM FORMING METHOD AND SEMICONDUCTOR DEVICE MANUFACTURING METHOD

[75] Inventors: Noboru Tokumasu; Kazuo Maeda, both of Tokyo, Japan

[73] Assignees: Canon Sales Co., Inc.; Semiconductor Process Laboratory Co., Ltd., both of Japan

[21] Appl. No.: 08/842,425

[22] Filed: Apr. 24, 1997

[30] Foreign Application Priority Data

Oct. 30, 1996 [JP] Japan .................................. 8-288787

[51] Int. Cl.[6] .................................................. H01L 21/443
[52] U.S. Cl. .......................... 438/623; 438/789; 438/790; 438/784
[58] Field of Search .................................. 438/632, 783, 438/784, 788, 789, 790

[56] References Cited

U.S. PATENT DOCUMENTS 4,708,884  11/1987  Chandross et al. .
5,409,743   4/1995  Bouffard et al. .

OTHER PUBLICATIONS

D.S. Williams, et al. "LPCVD of Borophosphosilicate Glass from Organic Reactants" *Electrochem. Soc.: Solid State Science and Technology* vol 134, No. 3, pp. 657–664, Mar. 1987.

R.M. Levin et al. "The Step Coverage of Undoped and Phosphorus–doped $SiO_2$ glass films" *J. Vac. Sci. Tech.* B 1(1) pp. 54–61, Jan.–Mar. 1983.

J. Sato et al. "Very low temperature CVD of $SiO_2$ films using ozone and organosilane" *Extended Abstracts of the Spring Meeting of the Electrochemical Soc.* pp. 31–33, May 1971.

*Primary Examiner*—Caridad Everhart
*Attorney, Agent, or Firm*—Lorusso & Loud

[57] ABSTRACT

A film forming method is provided for forming a planarized interlayer insulating film for covering interconnection layers, etc. of a semiconductor integrated circuit device. While supplying a reaction gas including a phosphorus containing compound which has III valence phosphorus and at least one bond of phosphorus to oxygen, a silicon containing insulating film including $P_2O_3$ is formed on a deposition substrate, thereby greatly reducing fluidization temperature for planarization.

20 Claims, 11 Drawing Sheets

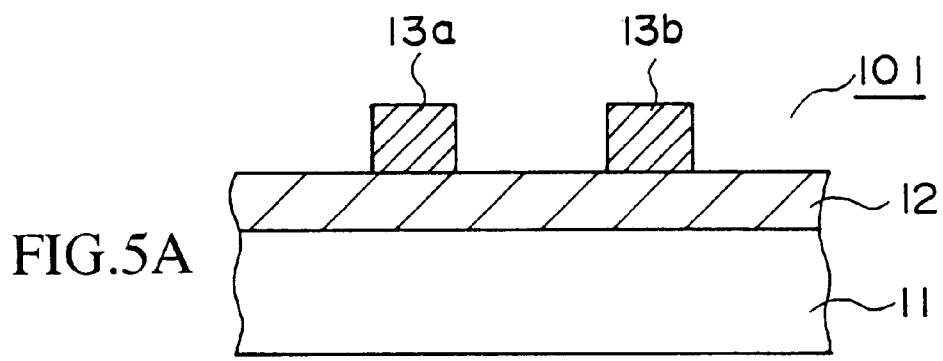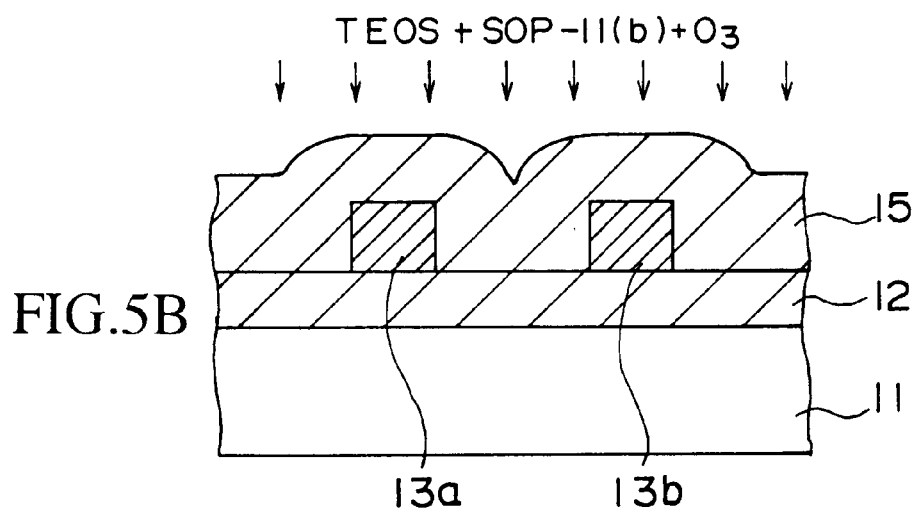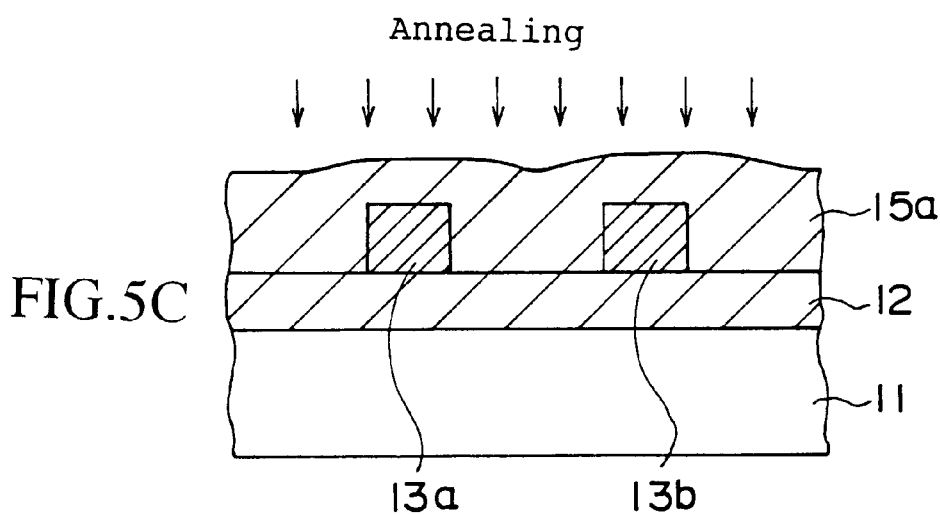

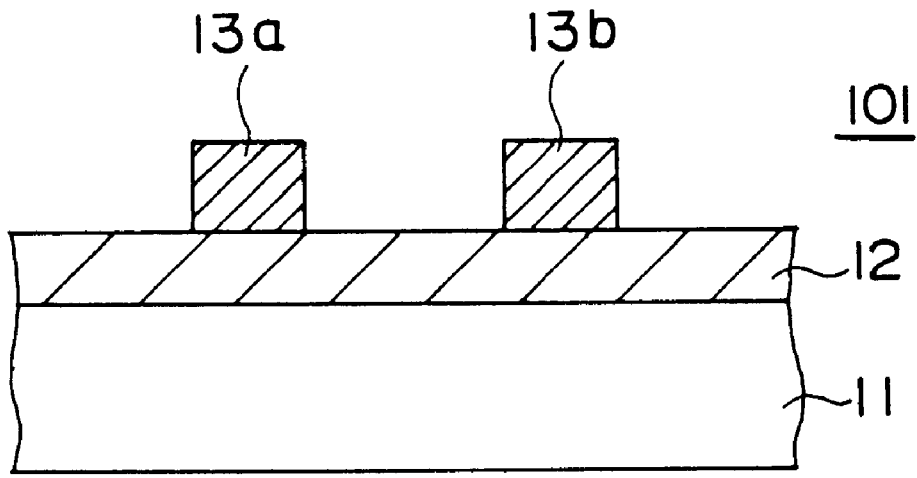
FIG.8A
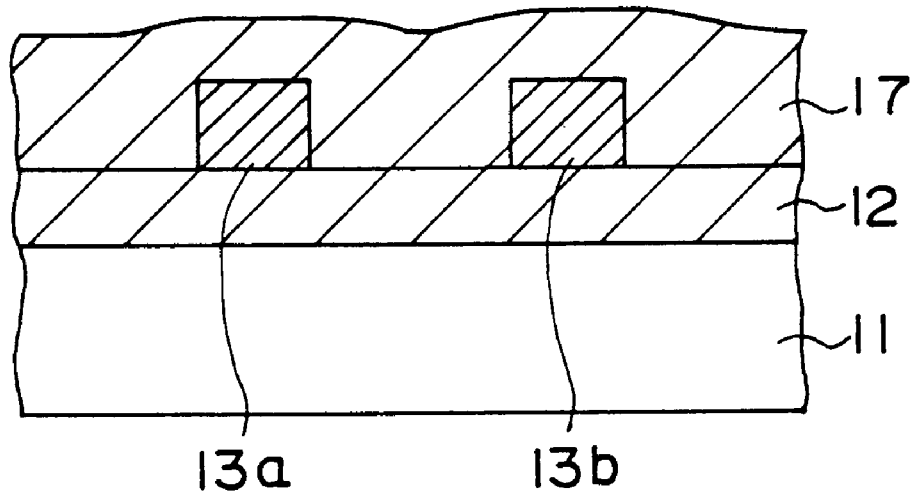
FIG.8B (P. Balk and J.M. Eldridge: Proc. IEEE, Vol.57, No.9, 1969)

FILM FORMING METHOD AND SEMICONDUCTOR DEVICE MANUFACTURING METHOD

BACKGROUND OF THE INVENTION

1. Field of the Invention

The present invention relates to a film forming method and a semiconductor device manufacturing method and, more particularly, a film forming method for use in forming a planarized interlayer insulating film for covering interconnection layers, etc. of a semiconductor integrated circuit device and a semiconductor device manufacturing method.

2. Description of the Prior Art

In recent years, the use of multilayered interconnection layers extending over several layers or more has increased with the progress in high integration density in the field of the semiconductor integrated circuit device. In such cases, an urgent need exists to develop a film forming method by which a planarized interlayer insulating film can be formed at a lower temperature of 500° C. or lower because aluminum material has often been used as the interconnection layers.

In the prior art, there have been two conventional methods used as a method for planarizing the insulating film. In one conventional method, as shown in FIGS. 1A and 1B, first a film is formed by a thermal CVD method, plasma enhanced CVD method, or the like and then the film is planarized by heating to produce fluid flow. In the other conventional planarizing methods, like the etching back method shown in FIGS. 2A to 2C or the CMP (chemical mechanical polishing) method shown in FIGS. 3A and 3B, unevenness of the surface of the insulating film is removed by etching or polishing.

In the case of the former, as shown in FIG. 1A, a BPSG (borophosphosilicate glass) film 4 is formed by the thermal CVD method using selectively the following reaction gases, (1) $SiH_4+PH_3+B_2H_6+O_2$ ($PH_3$: phosphine), and
(2) TEOS+TMOP+TMB or TEB+$O_2$ or $O_3$ (TEOS: tetraethylorthosilicate ($Si(OC_2H_5)_4$), TMOP: trimethylphosphate ($PO(OCH_3)_3$)).

Otherwise, as shown in FIG. 1A, the BPSG film 4 is formed by a plasma enhanced CVD method using selectively the following reaction gases, (1) $SiH_4+PH_3+B_2H_6+O_2$ and
(2) TEOS+TMOP+TMB or TEB+$O_2$.

See, for instance, Williams, D. S. and Dein, E. A.: J. Electrochem. Soc., 134,3,: 657, 1987, Levin, R. M. and Evans-Lutterodt, K.: J. Vac. Sci. Technol., B1, 1:54, 1983, and Sato, J. and Maeda, K.: Extended Abstract of Electrochem. Soc. Spring Meeting: 31, 1971.

After this, as shown in FIG. 1E, the BPSG film 4 thus formed is heated at about 850° C. to be fluidized, thereby achieving planarization of the surface. In the case of the PSG film, the PSG film is first formed by the thermal CVD method, plasma enhanced CVD method, etc., using a reaction gas lacking the boron containing gas ($B_2H_6$, TMB, or TEB) of the above described reaction gas, and then the PSG film thus obtained is heated at a temperature of 1000° C. or lower to be fluidized, so that the surface of the PSG film is planarized.

In the case of the latter, as shown in FIGS. 2A and 3A, a NSC film 5 is first formed by a thermal CVD method, plasma enhanced CVD method, or the like using one of the following reaction gases, (1) $SiH_4+O_2$ (thermal CVD method or plasma enhanced CVD method),
(2) TEOS+$O_2$ or $O_3$ (thermal CVD method), and
(3) TEOS+$O_2$ (plasma enhanced CVD method).

According to the etching back method, as shown in FIG. 2B, a resist film 6 is coated on the NSG film 5 so that an entire surface is planarized, and then, as shown in FIG. 2C, the planarized NSG film 5a is formed by an etching process. According to the CMP method, as shown in FIG. 3B, the above NSG film 5 is formed and then a surface of the NSG film 5b is planarized by polishing.

In FIGS. 1 to 3, a reference numeral 1 denotes a semiconductor substrate; 2, a ground insulating film; and 3a, 3b, interconnection layers formed on the ground insulating film 2.

The planarization by the etching back method and the CMP method described above is effective when a low temperature treatment is needed since no heating process is required, unlike the planarization method using fluidization by heating. However, as shown in FIGS. 2A, 2B and FIGS. 3A, 3B, if voids are formed in the concave portions between the interconnection layers 3a, 3b, etc. immediately after the insulating film 5 is formed, such voids still remain unchanged after planarization. At present, high density plasma CVD (HDP-CVD), plasma enhanced CVD, atmospheric pressure thermal CVD, SOG (spin-on-glass) coating, etc. are utilized for forming the insulating film with good adaptability for filling the concave portions. However, since the above planarization methods do not employ the thermal fluidizing step, it is difficult to completely embed the concave portions in the insulating film material if the distance between the interconnection layers is much narrowed due to higher integration density.

In contrast, in the planarization method using fluidization by heating, complete filling can be expected since thermal fluidity is employed, as shown in FIGS. 1A and 1B. At present, the BPSG film 4 is conventionally used in this application. However, since the BPSG film 4 has to be heated at least up to 850° C. to become fluid, it is not usable as the ground film 2 underlying the interconnection layers 3a, 3b and the interlayer insulating film 4, formed at the low temperature. In particular, the BPSG film 4 cannot be used as the insulating film for covering aluminum interconnection layers. The fluidizing temperature can be reduced to some extent if phosphorus or boron concentration is increased. However, such reduction is insufficient and this approach creates another problem in that stabilization and moisture resistance of the insulating films 2 4 are degraded. For the PSG film, the fluidization temperature is required to be substantially the same as that of the BPSG film and therefore the above problems occur similarly.

A GeBPSG film which can be formed by adding $GeO_2$ to the BPSG film has been developed for use as an insulating film with low fluidization temperature, but the temperature is merely reduced to about 750° C. Therefore, it is hard to use the GeBPSG film as the ground film and the interlayer insulating film which are to be processed at low temperature.

SUMMARY OF THE INVENTION

It is an object of the present invention to provide an insulating film forming method capable of greatly reducing fluidization temperature for planarization in a semiconductor device manufacturing method.

The present invention involves recognition of the following facts:

(1) the BPSG film or the PSG film in the prior art is formed of a mixture consisting of $SiO_2+P_2O_5+B_2O_3$ or a mixture consisting of $SiO_2+P_2O_5$ (Although $PH_3$ included in the reaction gas $SiH_4+PH_3+B_2H_6+O_2$ in the prior art is III valence phosphorus, it is bonded to externally supplied oxygen to thus generate $P_2O_5$ instead of $P_2O_3$. This is because, when $PH_3$ is bonded to externally supplied oxygen, stable $P_2O_5$ can be generated easily since $PH_3$ per se does not include oxygen.), (2) the BPSG film of the $P_2O_5$—$SiO_2$ system theoretically has a eutectic point of 850° C. spanning 20 to 80% of $P_2O_5$, as shown in FIG. 11, so that its fluidization temperature is mainly determined by the melting point of $P_2O_5$ itself, and (3) $P_2O_3$ has an extremely lower melting point than $P_2O_5$, as shown in Table 1.

TABLE I

| | Melting point | Boiling point |
|---|---|---|
| $P_2O_3$ (III valence) | 23.8° C. | 175.4° C. |
| $P_2O_5$ (V valence) | 580–585° C. | 300° C.(sublimation) |

(from Handbook of Chemistry and Physics published by CRC Press in 1978/88)

Recognizing the above facts, the inventors of the present invention have found that the fluidization temperature can be lowered if the BPSG film or the PSG film is formed to include mainly $P_2O_3$ in place of $P_2O_5$.

In order to provide a BPSG film or a PSG film having a high $P_2O_3$ concentration, the present invention utilizes a phosphorus containing compound in an oxygen deficient condition. For example, the present invention may (1) use as the reaction gas a phosphorus containing compound in which P is in its III valence state, or (2) form the BPSG film or the PSG film using a silicon containing compound or phosphorus containing compound including oxygen without addition of oxygen or ozone.

The phosphorus containing compounds including III valence P which can be utilized in method (1), include, for example, TMP (Trimethylphosphite (P(OCH3)$_3$) having the following formula:

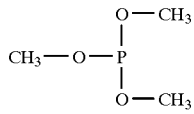

phosphorous acid dimethyl trimethylsilylester with a Si—O—P structure having the following formula:

(SOP-11 (a))

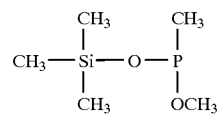

and phosphorous acid dimethoxy trimethylsilylester with a Si—O—P structure having the following formula:

(SOP-11 (b))

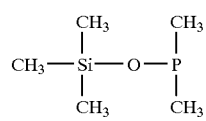

It should be understood that the TMP may also be used in method (2).

After the PSG film has been formed by the thermal CVD method or the plasma enhanced CVD method with the use of the reaction gas including the above phosphorus containing compound, components in the PSG film have been analyzed by X-ray fluorescence (XRF) analysis or Fourier-transform infrared spectroscopy (FTIR). As a result, it has been confirmed by the inventors of the present invention that a high concentration of $P_2O_3$ is included in the formed film. Further, a fluidization temperature ranging from 240 to 430° C. is achieved by the present invention.

The inventors of the present invention have also found that it is feasible to control the fluidization temperature by adjusting the $P_2O_3$ concentration and also that such $P_2O_3$ concentration can be readily adjusted by adjusting the film forming temperature, oxidizing gas (ozone) concentration, or gas flow rate of the phosphorus containing compound.

It should be understood that the above findings are similarly true of the BPSG film.

Other and further objects and features of the present invention will become obvious upon an understanding of the illustrative embodiments about to be described in connection with the accompanying drawings or will be indicated in the appended claims and various advantages not referred to herein will occur to one skilled in the art upon employing the invention in practice.

BRIEF DESCRIPTION OF THE DRAWINGS

FIGS. 5A to 5C are sectional views showing another film forming method for forming the PSG film including $P_2O_3$ according to the first embodiment of the present invention;

FIGS. 8A and 8B are sectional views showing a film forming method for forming a BPSG film including $P_2O_3$ according to a third embodiment of the present invention;

DETAILED DESCRIPTION OF THE EMBODIMENTS

Figure 1A:
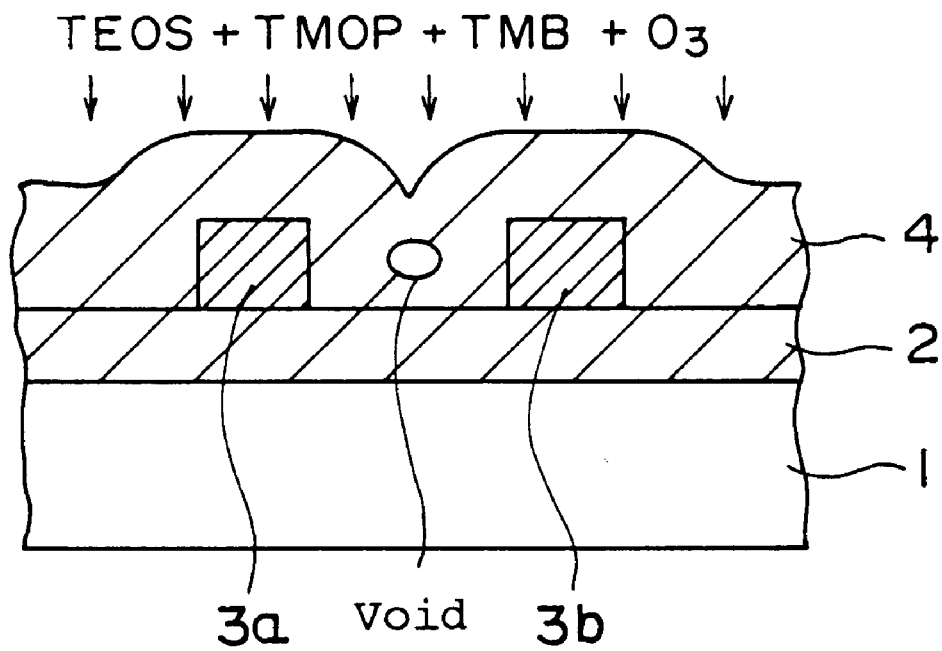
FIGS. 1A and 1B are sectional views showing an interlayer insulating film forming method including a planarization step utilizing heating and fluidization in accordance with the prior art.
Figure 1B:
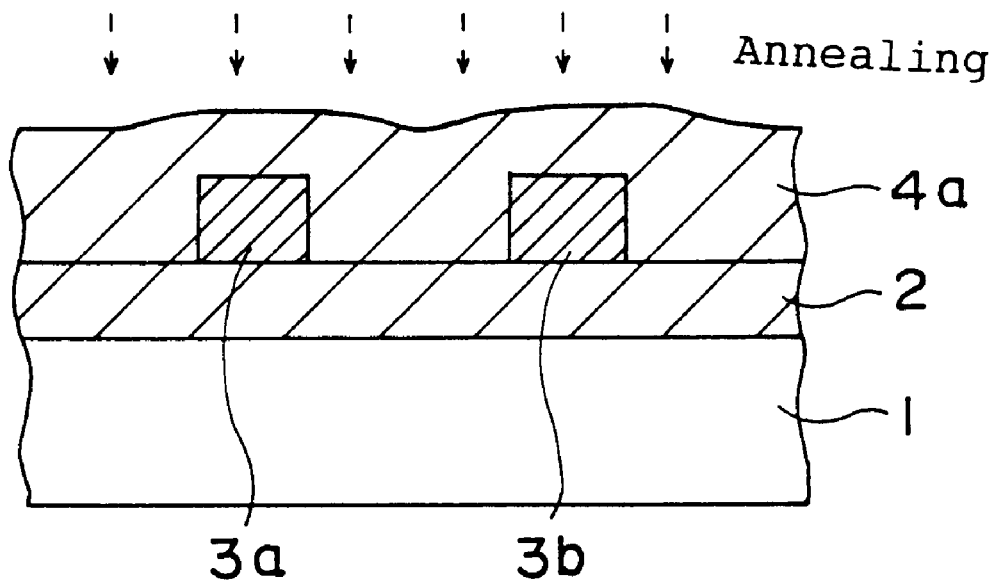
Figure 2A:
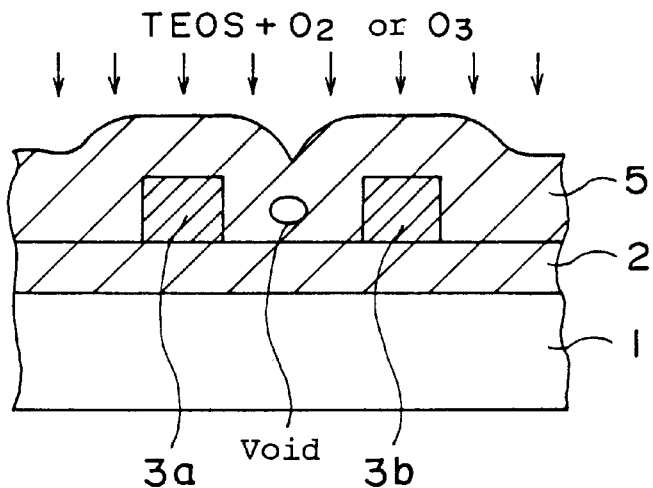
FIGS. 2A to 2C are sectional views showing another interlayer insulating film forming method including the planarization step utilizing heating and fluidization in accordance with the prior art.
Figure 2B:
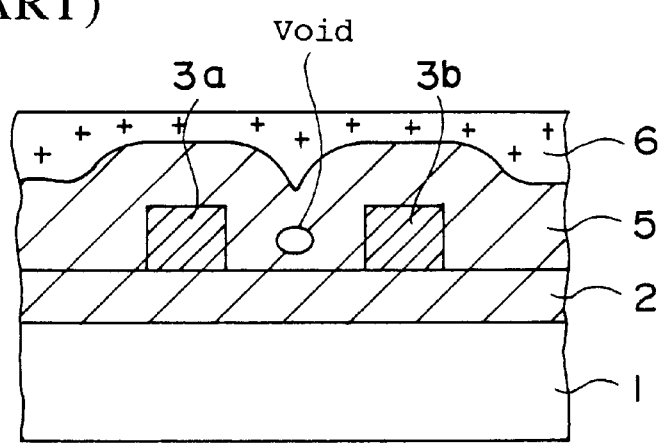
Figure 2C:
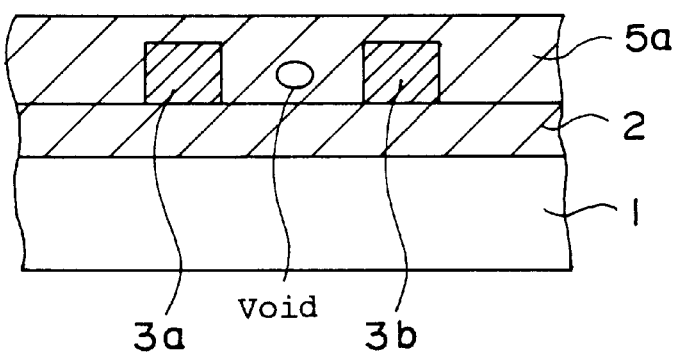
Figure 3A:
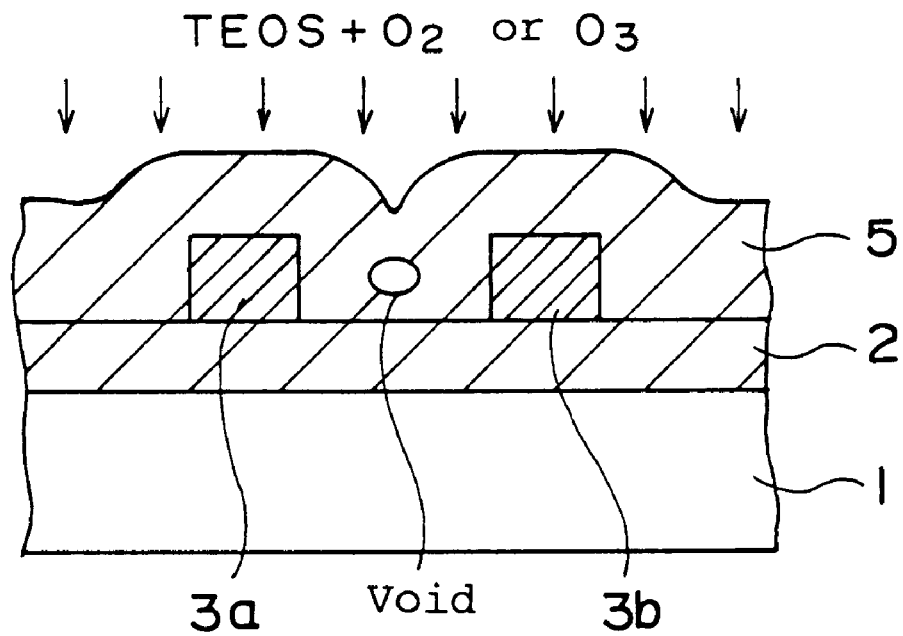
FIGS. 3A and 3B are sectional views showing still another interlayer insulating film forming method including planarization by CMP in accordance with the prior art.
Figure 3B:
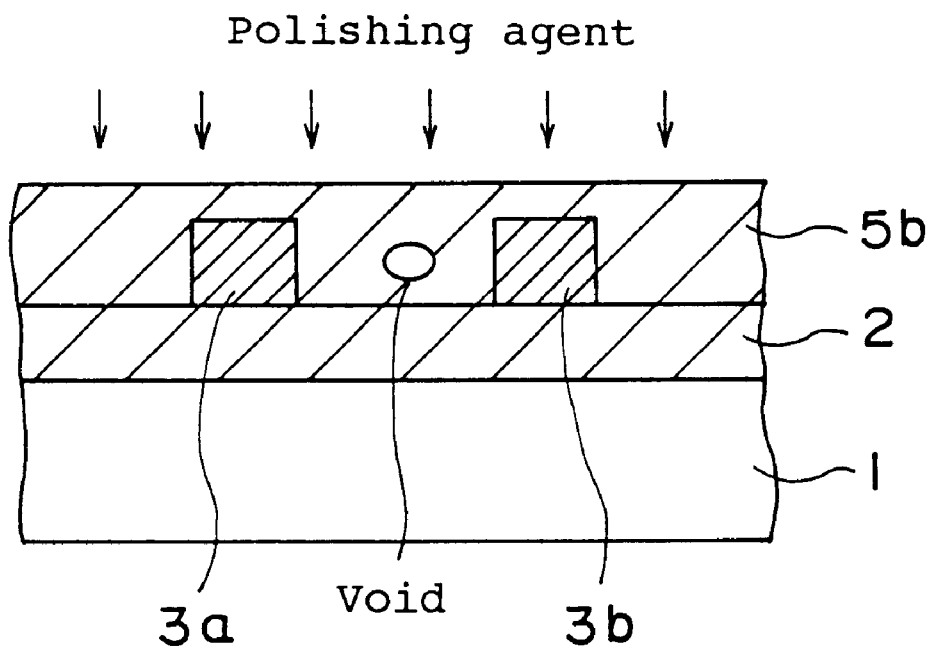

Various embodiments of the present invention will be described with reference to the accompanying drawings. It should be noted that the same or similar reference numerals are applied to the same or similar parts and elements throughout the drawings, and the description of the same or similar parts and elements will be omitted or simplified.

(1) FIRST EMBODIMENT

A first embodiment of the present invention involves formation of a PSG film by the thermal CVD method.

A gas mixture consisting of a phosphorus containing compound, a silicon containing compound, and an oxidizing gas is employed as a reaction gas.

As the phosphorus containing compound, TMP (trimethylphosphite ($P(OCH_3)_3$)) having the following formula:

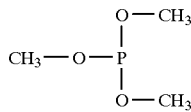

or a phosphorous acid dimethyl trimethylsilylester (referred to hereinafter as "SOP-11(a)") with a Si—O—P structure having the following formula:

(SOP-11 (a))

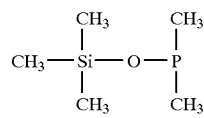

or a phosphorous acid dimethoxy trimethylsilylester (referred to hereinafter as "SOP-11(b)") with an Si—O—P structure having the following formula:

(SOP-11 (b))

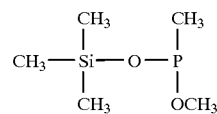

may be used. In addition to the above, a phosphorus containing compound having a III valence phosphorus and at least one bond of phosphorus to oxygen may be used as the phosphorus containing compound. SOP-11(b) is used by way of illustration of this embodiment.

As the silicon containing compound, an alkylsilane or an allylsilane (general formula: $R_nSiH_{4-n}$ (n=1–4)), an alkoxysilane (general formula: $(RO)_nSiH_{4-n}$ (n=1–4)), a chain siloxane (general formula: $R_nH_{3-n}SiO(R_kH_{2-k}SiO)_mSiH_{3-n}R_n$ (n=1–3; k=0–2; m≧0 2)), a derivative of a chain siloxane (general formula: $(RO)_nH_{3-n}SiOSiH_{3-n}(OR)_n$ (n=1–3)), or a ring siloxane (general formula: $(R_kH_{2-k}SiO)_m$ (k=1, 2; m≧2), etc. may be employed, wherein R is an alkyl radical, allyl radical, or derivatives thereof. By way of example, TMS (trimethoxysilane ($(CH_3O)_3SiH$) (an alkoxysilane) is used in this embodiment.

As the oxidizing gas, ozone ($O_3$), oxygen ($O_2$), $N_2O$, $NO_2$, $CO$, $CO_2$, $H_2O$, etc. may be employed. For the purposes of illustration, ozone is used in this embodiment.

A gas mixture consisting of the silicon containing compound, i.e., tetraethylorthosilicate (TEOS), the phosphorus containing compound (SOP-11(b)), and the oxidizing gas (ozone ($O_3$)) is used as the reaction gas. In order to collect comparative data, film forming conditions, i.e. the various film forming parameters, are changed as shown in Table II.

TABLE II

| Film forming parameter | Film forming condition |
|---|---|
| Substrate temperature | 240, 260, 280° C. |
| Ozone concentration | 1, 2, 3, 4, 5% |
| Gas flow rate of SOP-11(b) | 0.25, 0.5, 1.0, 1.5 SLM |

Film forming parameters other than the above (changed) film forming parameters are set to standard values. Such standard values of the film forming conditions are given in Table III.

TABLE III

| Film forming parameter | Standard film forming condition |
|---|---|
| Substrate temperature | 240° C. |
| Ozone concentration | 1% |
| Gas flow rate of SOP-11(b) | 0.25 SLM |

Since SOP-11(b) is a liquid at normal temperature, it is entrained in a carrier gas ($N_2$) by bubbling of the carrier gas ($N_2$) through same. The SOP-11(b) content can be controlled by adjusting the flow rate of the carrier gas. A part of oxygen can be converted into ozone by the ozonizer. The ozone concentration denotes the amount of ozone contained in oxygen.

Figure 4A:
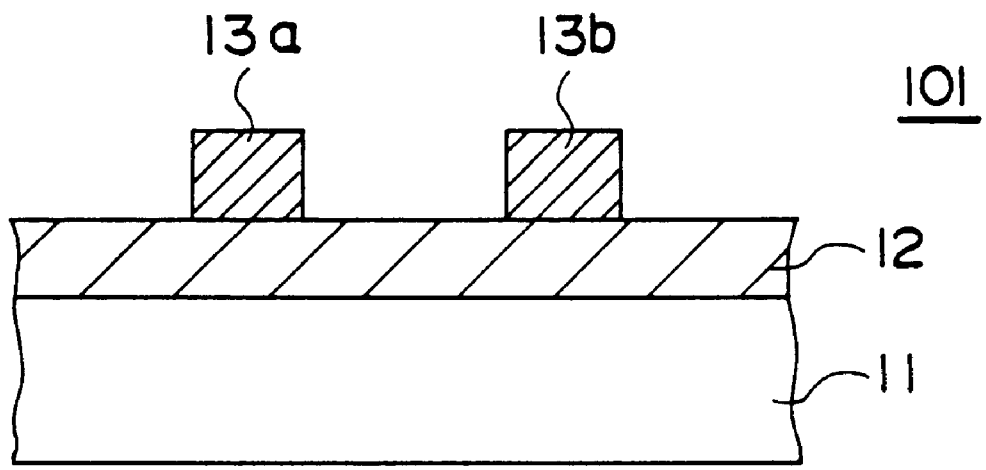
FIGS. 4A and 4B are sectional views showing a film forming method for forming a PSG film including $P_2O_3$ according to a first embodiment of the present invention.

First, a deposition substrate 101 as shown in FIG. 4A is loaded into the chamber of a thermal CVD apparatus. Then, the deposition substrate 101 is heated to and then maintained at a predetermined substrate temperature. The deposition substrate 101 is a ground insulating film 12, such as a silicon oxide film for example, formed on a silicon substrate (semiconductor substrate) 11 with interconnection layers 13a, 13b such as aluminum films, formed on the ground insulating film 12.

Figure 4B:
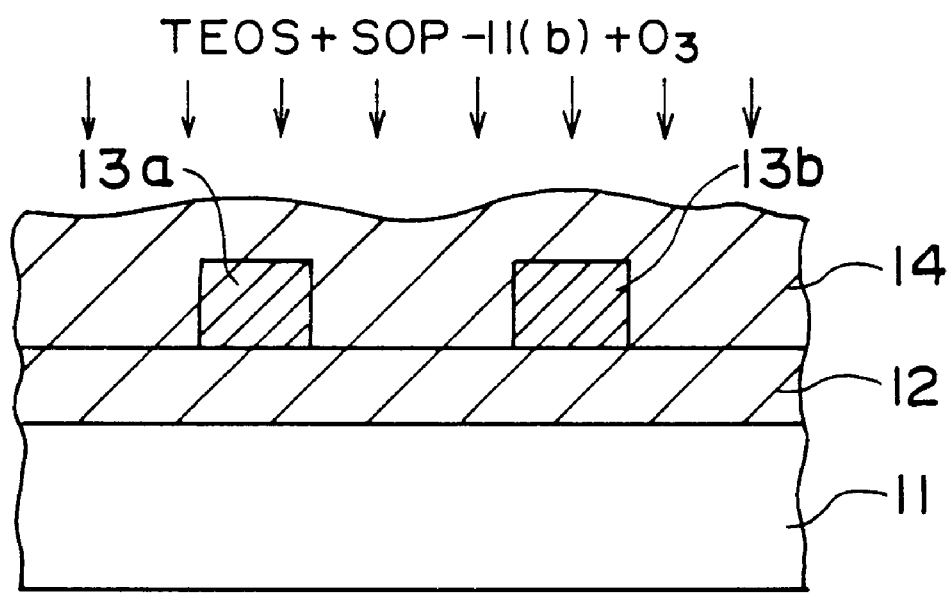

Next, as shown in FIG. 4B, the reaction gas is introduced into the chamber. The deposition substrate 101 is kept in this state for a predetermined time. As a result, a PSG film 14 including a high concentration of $P_2O_3$ is formed to a predetermined thickness. In some cases, fluidization of the PSG film 14 results around the substrate temperature, depending on the $P_2O_3$ concentration or the $P_2O_3/P_2O_5$ ratio during film formation. In this event, planarization as well as film formation can be achieved. Unless planarization can be achieved, as shown in FIGS. 5A to 5C, after a PSG film 15 is formed on the deposition substrate 101, the PSG film 15a is fluidized by a separate annealing so that a surface of the PSG film 15a is planarized.

Phosphorous (P) concentration in the PSG film 14 which is formed by the above steps is detected by X-ray fluorescence analysis (XRF) and Fourier-transform infrared spectroscopy (FTIR). Total concentration of $P_2O_3+P_2O_5$ in the PSG film 14 can be detected by X-ray fluorescence analysis (XRF) and $P_2O_5$ concentration alone in the PSG film 14 can be detected by Fourier-transform infrared spectroscopy (FTIR).

Figure 6A:
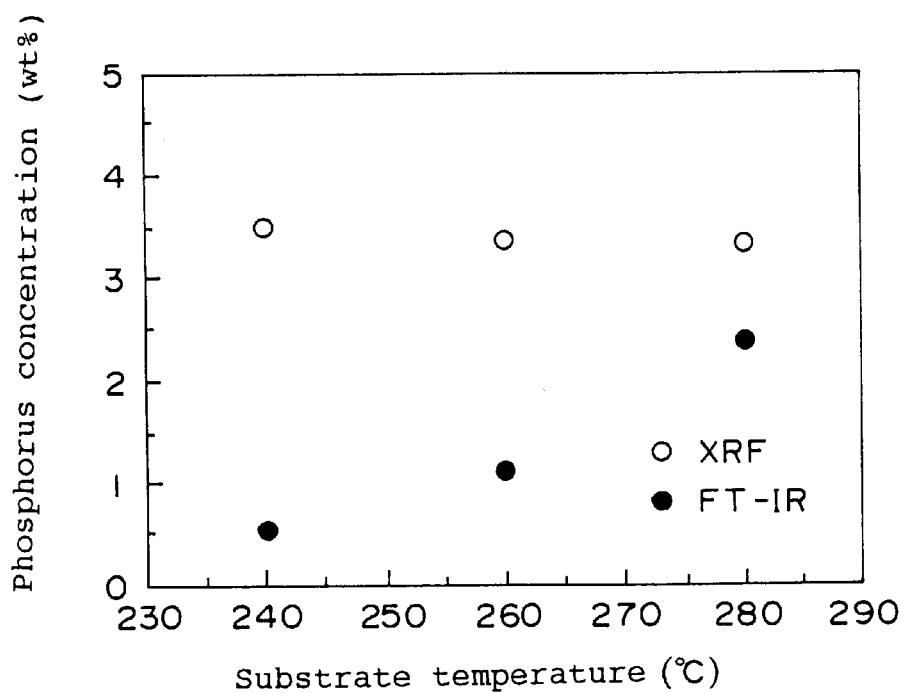
FIG. 6A is a graph showing the relationship between substrate temperature and phosphorus concentration in the PSG film including $P_2O_3$ formed by the film forming method according to the first embodiment of the present invention.
Figure 6B:
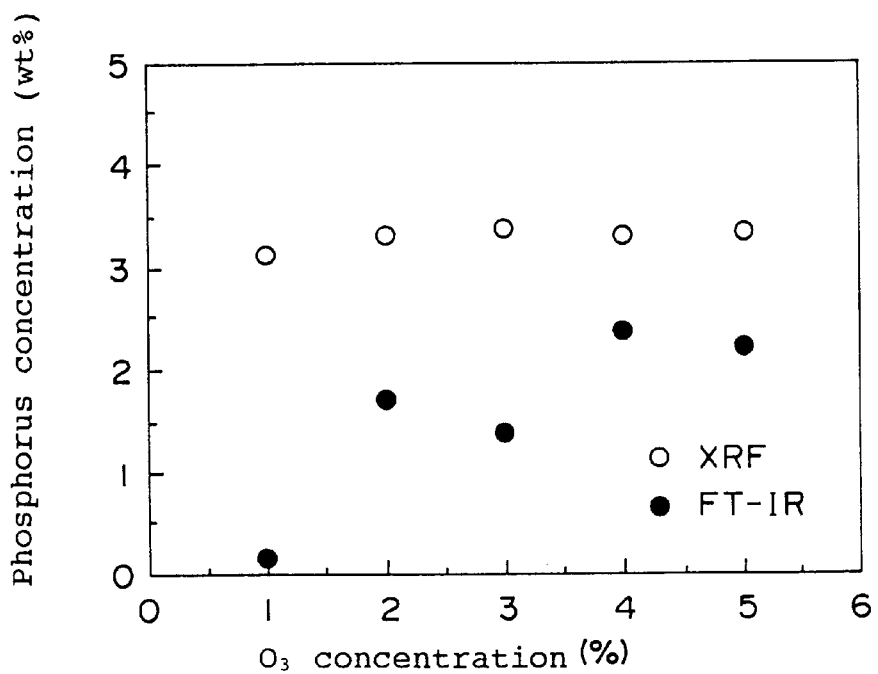
FIG. 6B is a graph showing the relationship between ozone concentration and phosphorus concentration in the PSG film including $P_2O_3$, formed by the film forming method according to the first embodiment of the present invention.
Figure 6C:
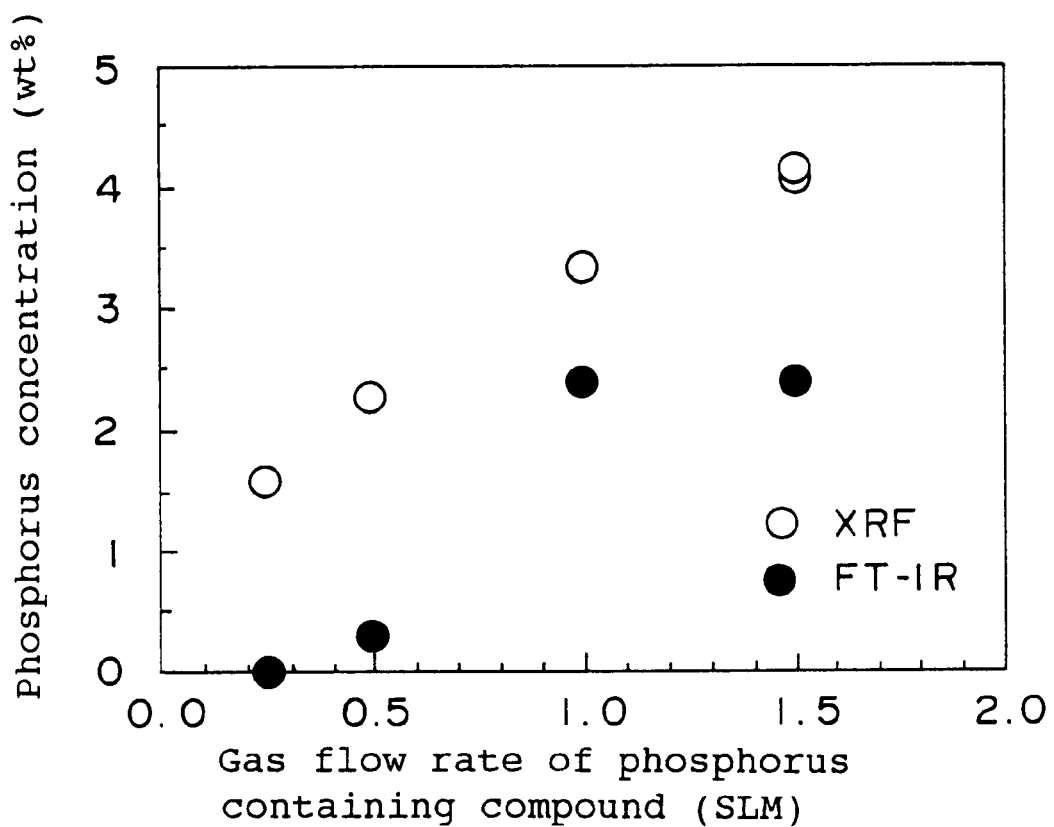
FIG. 6C is a graph showing the relationship between gas flow rate of a phosphorus containing compound and phosphorus concentration in the PSG film including $P_2O_3$, formed by the film forming method according to the first embodiment of the present invention.

Analysis results are shown in FIGS. 6A to 6C. FIG. 6A shows dependence of the phosphorous content in the PSG film on the substrate temperature, wherein the ordinate indicates the phosphorous concentration (wt %) in linear scale while the abscissa indicates the substrate temperature (°C.) in linear scale. FIG. 6B shows dependence thereof on the ozone concentration, wherein the ordinate indicates the phosphorous concentration (wt %) in linear scale while the abscissa indicates the ozone concentration (%) in linear scale. FIG. 6C shows dependence thereof on the gas flow rate of a phosphorus containing compound, wherein the ordinate indicates the phosphorous concentration (wt %) in linear scale while the abscissa indicates the gas flow rate of SOP-11 (SLM) in linear scale.

In FIGS. 6A to 6C, white round marks represent total concentration of $P_2O_3+P_2O_5$ in the PSG film, which are the results of analysis by XRF. Black round marks represent $P_2O_5$ concentration in the PSG film, which are the results of analysis by FTIR. In FIGS. 6A to 6C, differences between white round marks and black round marks correspond to $P_2O_3$ concentration in the PSG film.

From the above results, it has been found that $P_2O_3$ concentration or the $P_2O_3/P_2O_5$ ratio in the PSG film thus formed can be adjusted by controlling the substrate temperature, the ozone concentration, and the gas flow rate of SOP-11.

The melting temperature or fluidization temperature of the PSG film 14 becomes lower as the $P_2O_3$ concentration or $P_2O_3/P_2O_5$ ratio in the PSG film 14 becomes higher. The melting temperature or fluidization temperature of 500° C. or lower has been derived experimentally.

(2) SECOND EMBODIMENT

Figure 7A:
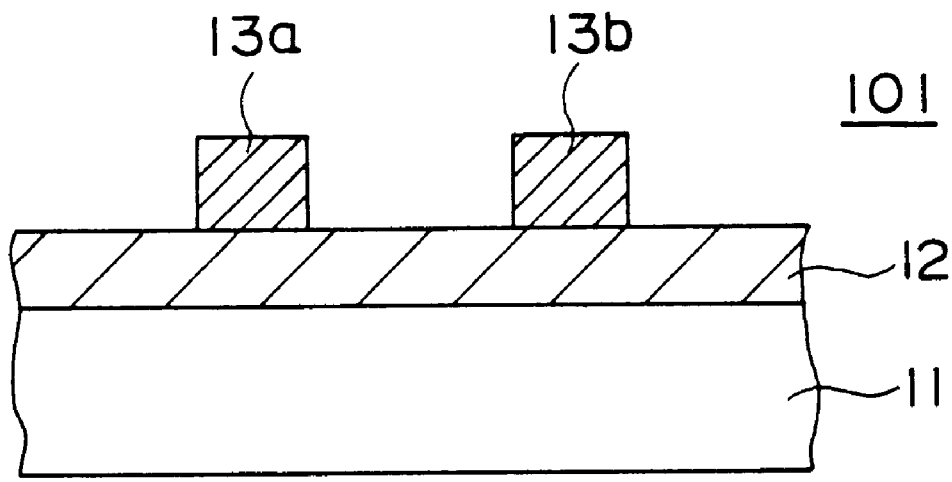
FIGS. 7A and 7B are sectional views showing a film forming method for forming a PSG film including $P_2O_3$ according to a second embodiment of the present invention.
Figure 7B:
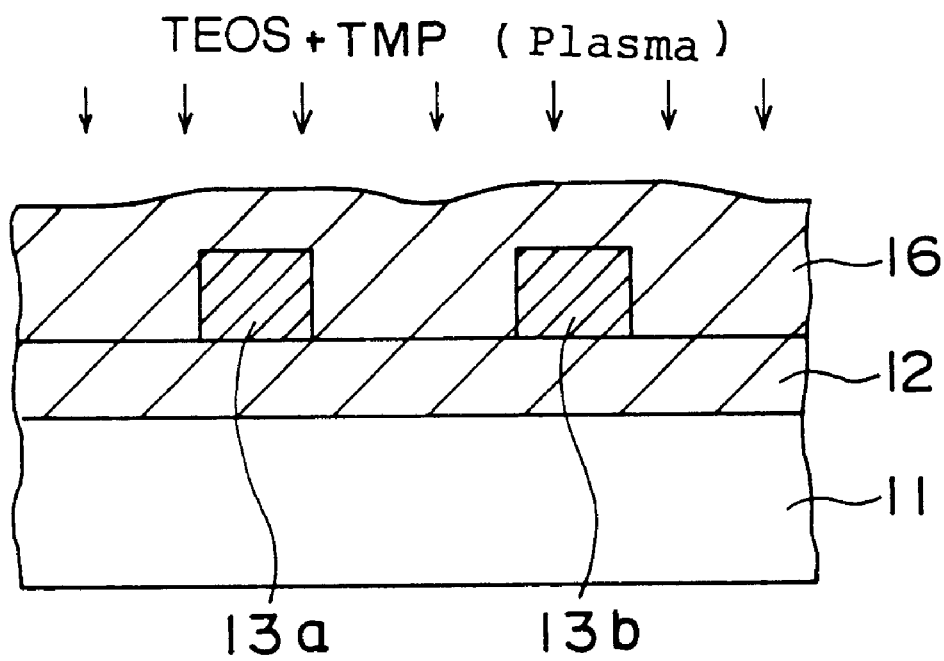

A PSG film including $P_2O_3$ is formed by plasma enhanced CVD, as explained with reference to FIGS. 7A and 7B, in a second embodiment of the present invention.

As the reaction gas, a gas mixture of TEOS+TMP is employed. In order to sufficiently satisfy the requirement for an oxygen deficient condition, no oxygen ($O_2$) is added to the reaction gas. The formula of TMP (trimethyiphosphite ($P(OCH_3)_3$)) is shown in the following.

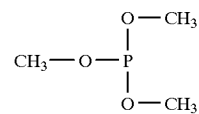

Film forming conditions are given as follows. Plasma enhanced CVD based on ECR is employed as the film forming method.

TABLE IV

| Film forming parameter | Film forming condition |
| --- | --- |
| Substrate temperature | 240–400° C. |
| Gas pressure in chamber | 3 mTorr |
| TEOS flow rate | 0.1–1 SLM |
| TMP flow rate | 0.1–0.5 SLM |
| Applied power | 50 w–2.3 kW |
| Frequency | 2.45 GHz |
| Substrate bias power | 50–300 W |
| Frequency | 13.56 MHz |

The PSG film 16 which is provided has the capability to flow into a recess between the interconnection layers 13a, 13b at a substrate temperature of about 200° C. FIG. 7A shows the sectional shape of the deposition substrate 101 before the PSG film 16 is formed thereon. FIG. 7B shows the sectional shape of the PSG film 16 formed on the deposition substrate 101 after the film formation has been completed.

From the foregoing experimental results, it can be deduced that phosphorus is included in the PSG film 16 in the form of P III valence $P_2O_3$. Since oxygen is not externally supplied, the reaction system is in an oxygen deficient condition and therefore it may be supposed that the Si—O and P—O groups in the PSG film 16 are respectively bonded to oxygen atoms in molecules.

In the second embodiment, no oxygen has been added. However, needless to say, like the first embodiment, the melting temperature or fluidization temperature of the PSG film 16 can also be controlled by adjusting the $P_2O_3$ concentration or the $P_2O_3/P_2O_5$ ratio in the PSG film 16. As in the first embodiment, the melting temperature or fluidization temperature of the PSG film 16 can also be controlled via the adjustment of the $P_2O_3$ concentration or the rate of $P_2O_3/P_2O_5$ ratio, even if another film forming parameter such as the substrate temperature or TMP flow rate is controlled.

(3) THIRD EMBODIMENT

A BPSG film including $P_2O_3$ is formed by a thermal CVD method or plasma enhanced CVD method, as will be explained with reference to FIGS. 8A and 8B according to a third embodiment of the present invention.

A gas mixture of TEOS+SOP-11(b)+TMP or TEB+$O_2$ or $O_3$ is employed as the reaction gas.

Film forming conditions are given in Table V.

TABLE V

| Thermal CVD method | |
| --- | --- |
| Film forming parameter | Film forming condition |
| Substrate temperature | 200–400° C. |
| Ozone concentration | 0.3–2.5% |

TABLE V-continued

Thermal CVD method

| Film forming parameter | Film forming condition |
| --- | --- |
| Gas flow rate of SOP-11(b) | 0.1–1.5 SLM |
| Gas flow rate of TMB or TEB | 0.1–1.0 SLM |

TABLE VI

Plasma enhanced CVD method (ECR P-CVD method)

| Film forming parameter | Film forming condition |
| --- | --- |
| Substrate temperature | 80–350° C. |
| Gas pressure in chamber | 3–100 mTorr |
| TEOS flow rate | 0.05–0.3 SLM |
| TMP flow rate | 0.05–0.5 SLM |
| TMB or TEB flow rate | 0.05–0.4 SLM |
| Applied power | 200 W–1.5 kW |
| Frequency | 13.56 MHz |
| Substrate bias power | 100–300 W |
| Frequency | 13.56 MHz |

FIG. 8A shows the sectional shape of the deposition substrate 101 before a BPSG film 17 is formed thereon. Under the above conditions, as shown in FIG. 8B, the BPSG film 17 consisting of a mixture of $SiO_2+P_2O_3+B_2O_3$ is formed on the deposition substrate 101.

In the same manner as in the first embodiment, the $P_2O_3$ concentration or the $P_2O_3/P_2O_5$ ratio can be adjusted by controlling oxygen concentration or ozone concentration, substrate temperature, phosphorus containing compound or boron containing compound, so that the melting point of the BPSG film 17 is controllable within the range of 200° C. to 500° C.

(4) FOURTH EMBODIMENT

Because $P_2O_3$ per se readily reacts with humidity, the PSG films 14, 15a, 16 and the BPSG film 17 formed as described above would absorb humidity when they are unloaded from the chamber into the air after film formation has been completed. Therefore, in order to use them as the interlayer insulating film, etc. of the semiconductor device, the PSG films 14, 15a, 16 and the BPSG film 17 including $P_2O_3$ must be stabilized to prevent such humidity absorption.

Figure 9:
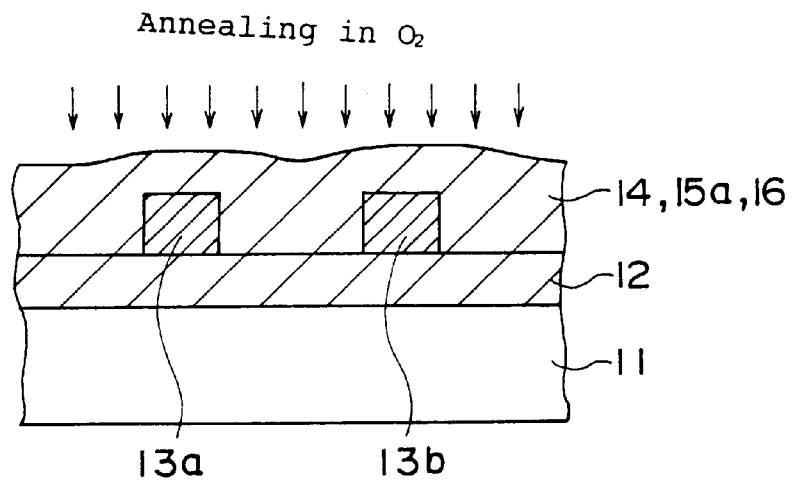
FIG. 9 is a sectional view showing a method for stabilizing the PSG film including $P_2O_3$ according to a fourth embodiment of the present invention.

A method for stabilizing the PSG films 14, 15a, 16 including $P_2O_3$ will be explained with reference to FIG. 9 according to a fourth embodiment of the present invention.

After the PSG film 14, 15a, 16 has been formed by the film forming method according to the first embodiment, $N_2+O_2$ is introduced into the chamber, i.e., a sealed container, and then the PSG film 14, 15a, 16 is annealed at a temperature of about 500° C. in such an atmosphere.

Figure 10:
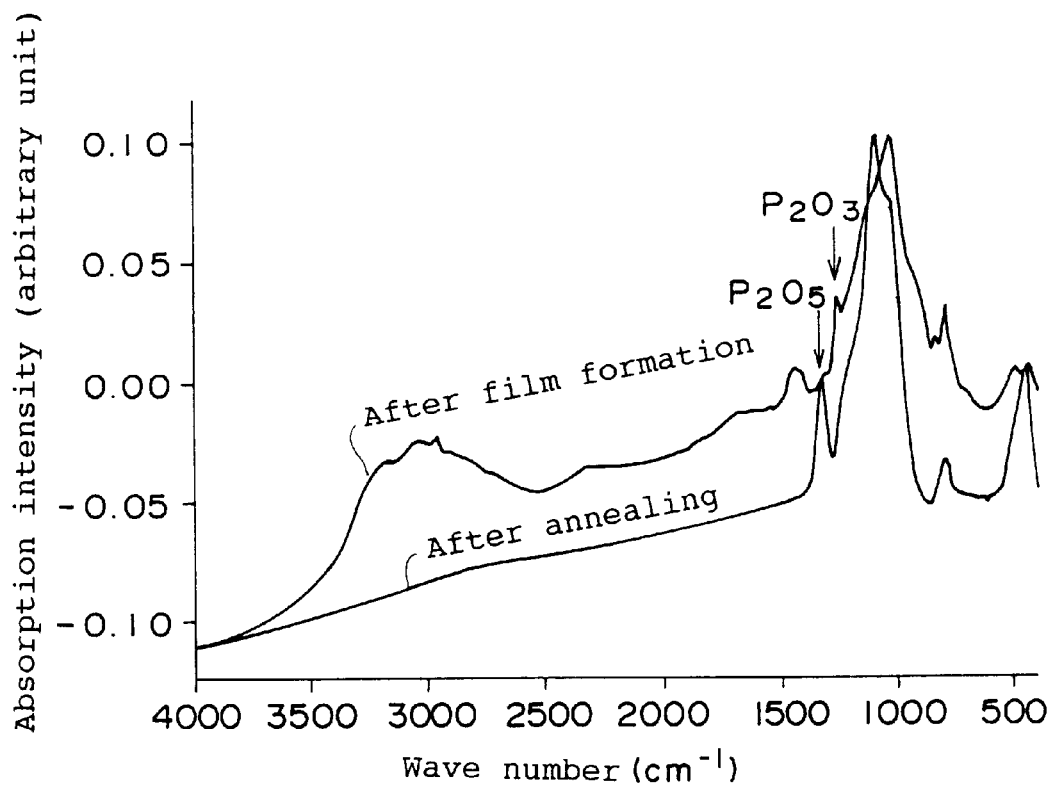
FIG. 10 is a view showing the analysis results of types of phosphorous compound in the PSG film by Fourier-transform infrared spectroscopy (FTIR) before and after stabilization according to the fourth embodiment of the present invention.
Figure 11:
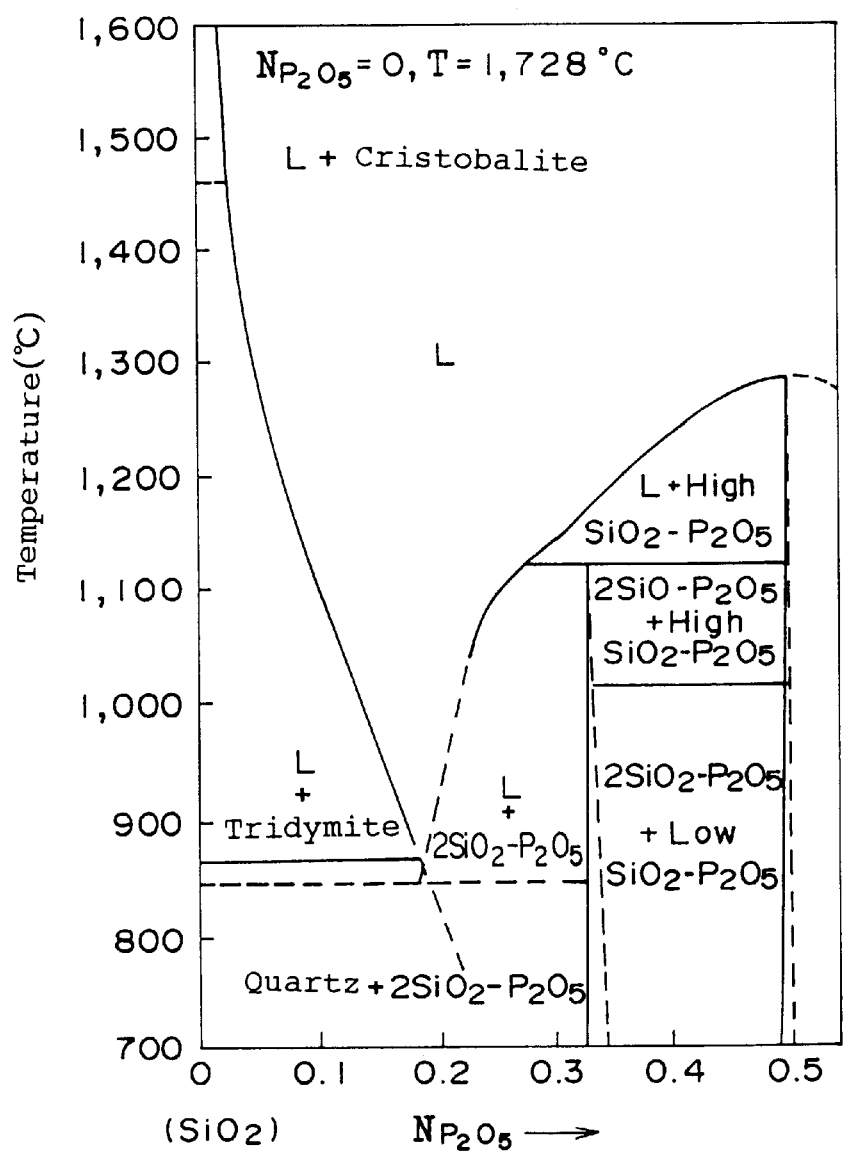
FIG. 11 is a phase diagram for a $P_2O_5$—$SiO_2$ glass system.

FIG. 10 shows the FTIR analysis results for types of phosphorous compound in the PSG films 14, 15a, 16 before and after annealing, i.e., stabilization according to the fourth embodiment of the present invention. As shown in FIG. 10, $P_2O_3$ in the PSG films 14, 15a, 16 can be changed into $P_2O_5$ by annealing.

As stated earlier, the PSG films 14, 15a, 16, etc. can be stabilized by changing $P_2O_3$ into $P_2O_5$ by annealing in an oxygen atmosphere after film formation. Further, a final composition of $P_2O_5$ can provide a passivation effect on the PSG films 14, 15a, 16, etc. to thus contribute stabilization of boundary characteristics. Residual carbon included in the PSG film can be oxidized simultaneously by such annealing.

With the above process, the PSG films 14, 15a, 16, etc. may be usable in the device.

In place of such annealing or together with such annealing, a cover insulating film may be formed on the PSG films 14, 15a, 16, etc. to prevent humidity absorption.

The thermal CVD equipment or the plasma enhanced CVD equipment is employed as the CVD equipment and then an annealing furnace is employed to improve film quality. To enable improvement of the film quality directly without exposure of the PSG film to the atmosphere after film formation, it is desirable to employ as an apparatus a CVD apparatus and an annealing furnace which are connected by a load lock chamber.

In the above first to fourth embodiments, since the insulating film have a high $P_2O_3$ concentration for the phosphorous component, the fluidization temperature can be extremely lowered to 500° C. or lower. Hence, the PSG film and the BPSG film can be used as the interlayer insulating film to cover the aluminum interconnection. Even if the semiconductor device has shallow diffusion layers as dictated by need for high integration density, the PSG film and the BPSG film are used as the ground insulating film for the interconnection layer and redistribution of impurities in the diffusion layer can be prevented.

In addition, since the interlayer insulating film can be planarized by means of thermal fluidization, without planarization methods such as CMP after film formation, concave portions between the interconnection layers, etc. can be buried to leave no space, i.e., to eliminate voids, in the interlayer insulating film.

Various modifications will become apparent to those skilled in the art from the teachings of the present disclosure without departing from the scope of the claims.

We claim:

1. A film forming method comprising the steps of:
   supplying a reaction gas including a phosphorus-containing compound which has III valence phosphorus within a Si—O—P structure; and
   contacting said reaction gas with a deposition substrate to form a silicon containing insulating film including $P_2O_3$ on the deposition substrate.

2. A film forming method according to claim 1, wherein said phosphorus containing compound is phosphorous acid dimethyl trimethyisilylester having the following formula:

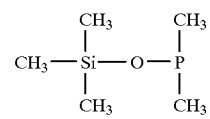

or phosphorous acid dimethoxy trimethyisilylester having the following formula:

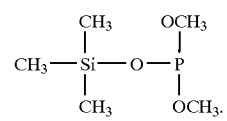

3. A film forming method according to claim 1, wherein said reaction gas is excited by heating or by conversion into a plasma.

4. A film forming method according to claim 1, further comprising heating said deposition substrate at 400° C. or lower during said contacting step.

5. A film forming method according to claim 1, wherein said silicon containing insulating film including $P_2O_3$ is a phosphosilicate glass film or a boronphosphosilicate glass film.

6. A film forming method according to claim 1, further comprising the step of:
   after said silicon containing insulating film including $P_2O_3$ is formed, heating said silicon containing insulating film to become fluid such that a surface of said silicon containing insulating film is planarized.

7. A film forming method according to claim 6, wherein said silicon containing insulating film is heated at a temperature of 700° C. or lower.

8. A film forming method according to claim 6, wherein said silicon containing insulating film is heated at a temperature of 500° C. or lower.

9. A film forming method according to claim 1, further comprising the step of:
   after said silicon containing insulating film including $P_2O_3$ is formed, heating said silicon containing insulating film including $P_2O_3$ in an oxygen-containing atmosphere so as to convert $P_2O_3$ in said silicon containing insulating film into $P_2O_5$.

10. A film forming method according to claim 6, further comprising the step of:
    after said silicon containing insulating film including $P_2O_3$ is heated to be fluidized and a surface thereof is planarized, heating said silicon containing insulating film including $P_2O_3$ in an oxygen-containing atmosphere so as to convert $P_2O_3$ in said silicon containing insulating film into $P_2O_5$.

11. A semiconductor device manufacturing method comprising the steps of:
    forming a interconnection layer on an insulating film supported on a substrate;
    supplying a reaction gas including a phosphorus-containing compound which has III valence phosphorus within a Si—O—P structure; and
    contacting said reaction gas with said interconnection layer to form a silicon containing insulating film including $P_2O_3$ covering said interconnection layer.

12. A film forming method according to claim 11, wherein said phosphorus-containing compound is phosphorous acid dimethyl trimethyisilylester having the following formula:

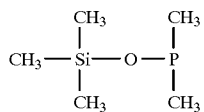

or phosphorous acid dimethoxy trimethyisilylester having the following formula:

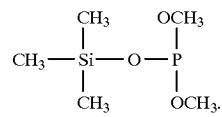

13. A film forming method according to claim 11, further comprising heating said substrate at 400° C. or lower during said contacting step.

14. A film forming method according to claim 11, wherein said silicon containing insulating film including $P_2O_3$ is a phosphosilicate glass film or a boronphosphosilicate glass film.

15. A semiconductor device manufacturing method according to claim 11, wherein said interconnection layer is formed of aluminum or aluminum alloy.

16. A film forming method according to claim 11, further comprising the step of:
    after said silicon containing insulating film including $P_2O_3$ is formed, heating said silicon containing insulating film to become fluid such that a surface of said silicon containing insulating film is planarized.

17. A film forming method according to claim 16, wherein said silicon containing insulating film is heated at a temperature of 700° C. or lower.

18. A film forming method according to claim 16, wherein said silicon containing insulating film is heated at a temperature of 500° C. or lower.

19. A film forming method according to claim 11, further comprising the step of:
    after said silicon containing insulating film including $P_2O_3$ is formed, heating said silicon containing insulating film including $P_2O_3$ in an oxygen-containing atmosphere so as to convert $P_2O_3$ in said silicon containing insulating film into $P_2O_5$.

20. A film forming method according to claim 16, further comprising the step of:
    after said silicon containing insulating film including $P_2O_3$ is heated to become fluid and a surface thereof is planarized, heating said silicon containing insulating film including $P_2O_3$ in an oxygen-containing atmosphere so as to convert $P_2O_3$ in said silicon containing insulating film into $P_2O_5$.

* * * * *

UNITED STATES PATENT AND TRADEMARK OFFICE
CERTIFICATE OF CORRECTION

PATENT NO.   : 5,915,200
DATED        : June 22, 1999
INVENTOR(S)  : Tokumasu et al.

It is certified that error appears in the above-identified patent and that said Letters Patent is hereby corrected as shown below:

Column 2,
Line 46, "2 4" should read -- 2, 4 --

Column 3,
Line 45, " (P(OCH3) $_3$) " should read -- (P (OCH$_3$) $_3$) --.

Column 4,
Lines 1-8,

"
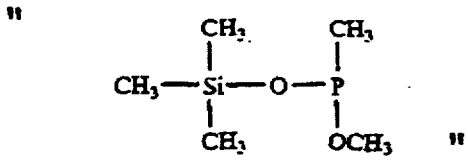
(SOP-11 (b))
"

should read:

--
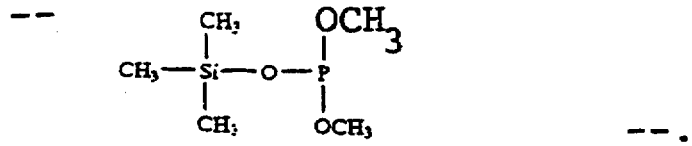
(SOP-11 (b))
--.

Column 6,
Lines 1-8,

"
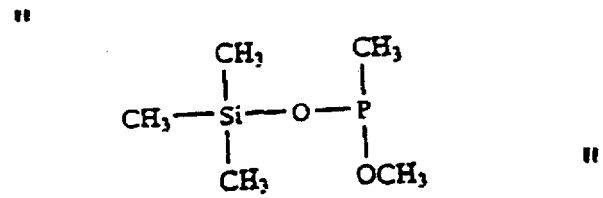
(SOP-11 (b))
"

UNITED STATES PATENT AND TRADEMARK OFFICE
CERTIFICATE OF CORRECTION

PATENT NO.   : 5,915,200
DATED        : June 22, 1999
INVENTOR(S)  : Tokumasu et al.

It is certified that error appears in the above-identified patent and that said Letters Patent is hereby corrected as shown below:

should read:

(SOP-11 (b))

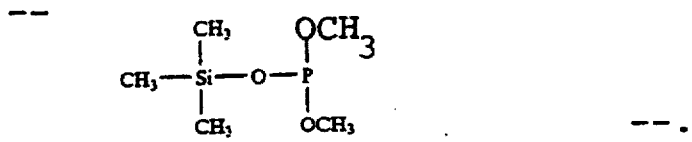

--.

Column 6,
Line 19, "m≥02" should read -- m≥2 --.

Column 7,
Line 66, "trimethyiphosphite" should read -- trimethylphosphite --.

Column 8,
Line 46, delete "rate of".

Column 10,
Line 16, "film" should read -- films --;
Line 45, "trimethyisilylester" should read -- trimethylsilylester --.
Line 53, "trimethyisilylester" should read -- trimethylsilylester --.

Column 11,
Line 45, "trimethyisilylester" should read -- trimethylsilylester --.

Column 12,
Line 1, "trimethyisilylester" should read -- trimethylsilylester --.
Lines 3-9,

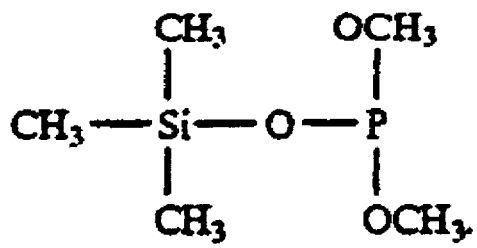

UNITED STATES PATENT AND TRADEMARK OFFICE
CERTIFICATE OF CORRECTION

PATENT NO. : 5,915,200
DATED : June 22, 1999
INVENTOR(S) : Tokumasu et al.

It is certified that error appears in the above-identified patent and that said Letters Patent is hereby corrected as shown below:

should read:

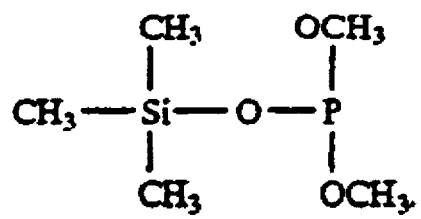

Signed and Sealed this

Fifth Day of February, 2002

Attest:

JAMES E. ROGAN
*Director of the United States Patent and Trademark Office*

*Attesting Officer*